United States Patent [19]

Furuyama et al.

[11] Patent Number: 5,265,057
[45] Date of Patent: Nov. 23, 1993

[54] SEMICONDUCTOR MEMORY

[75] Inventors: Tohru Furuyama, Tokyo; Hiroyuki Noji, Kawasaki, both of Japan

[73] Assignee: Kabushiki Kaisha Toshiba, Kawasaki, Japan

[21] Appl. No.: 813,510

[22] Filed: Dec. 26, 1991

[30] Foreign Application Priority Data

Dec. 26, 1990 [JP] Japan ................................ 2-418374

[51] Int. Cl.[5] ............................................. G11C 29/00
[52] U.S. Cl. .................................. 365/201; 365/230.06
[58] Field of Search .............. 365/201, 230.06, 230.08, 365/230.05, 189.09

[56] References Cited

U.S. PATENT DOCUMENTS

| | | | |
|---|---|---|---|
| 4,349,895 | 9/1982 | Isogai | 365/230.06 |
| 4,951,259 | 8/1990 | Sato | 365/230.06 |
| 4,972,372 | 11/1990 | Ueno | 365/201 |
| 5,086,413 | 2/1992 | Tsuboi | 365/201 |
| 5,161,121 | 11/1992 | Cho | 365/230.06 |

*Primary Examiner*—Eugene R. LaRoche
*Assistant Examiner*—A. Zarabian
*Attorney, Agent, or Firm*—Banner, Birch, McKie & Beckett

[57] ABSTRACT

There is provided a semiconductor memory including a plurality of word lines, a plurality of bit lines intersecting the word lines, and a memory cell array having memory cells arranged at respective intersections of the word lines and bit lines. Word line selecting circuits select the word lines in accordance with an address signal and word line driving circuits are connected to the word lines for driving selected word lines. Selective stress applying circuitry selectively applies stress, during a stress test, to word lines in one of a plurality of word line groups into which all word lines are classified. The selective stress applying circuits includes an arrangement of MOS transistors and pads for applying stress to a word line group during the stress test.

10 Claims, 7 Drawing Sheets

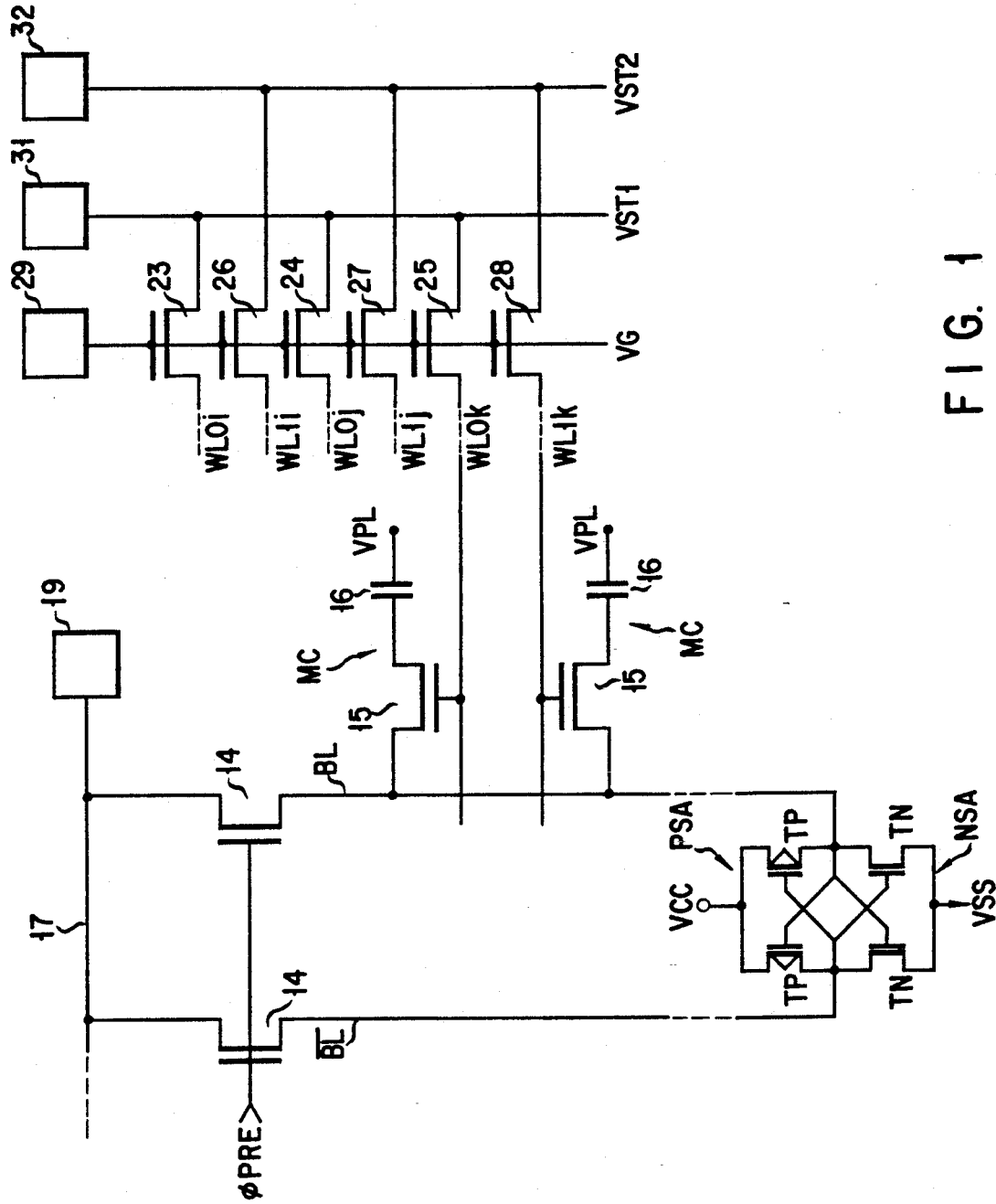
F I G. 1

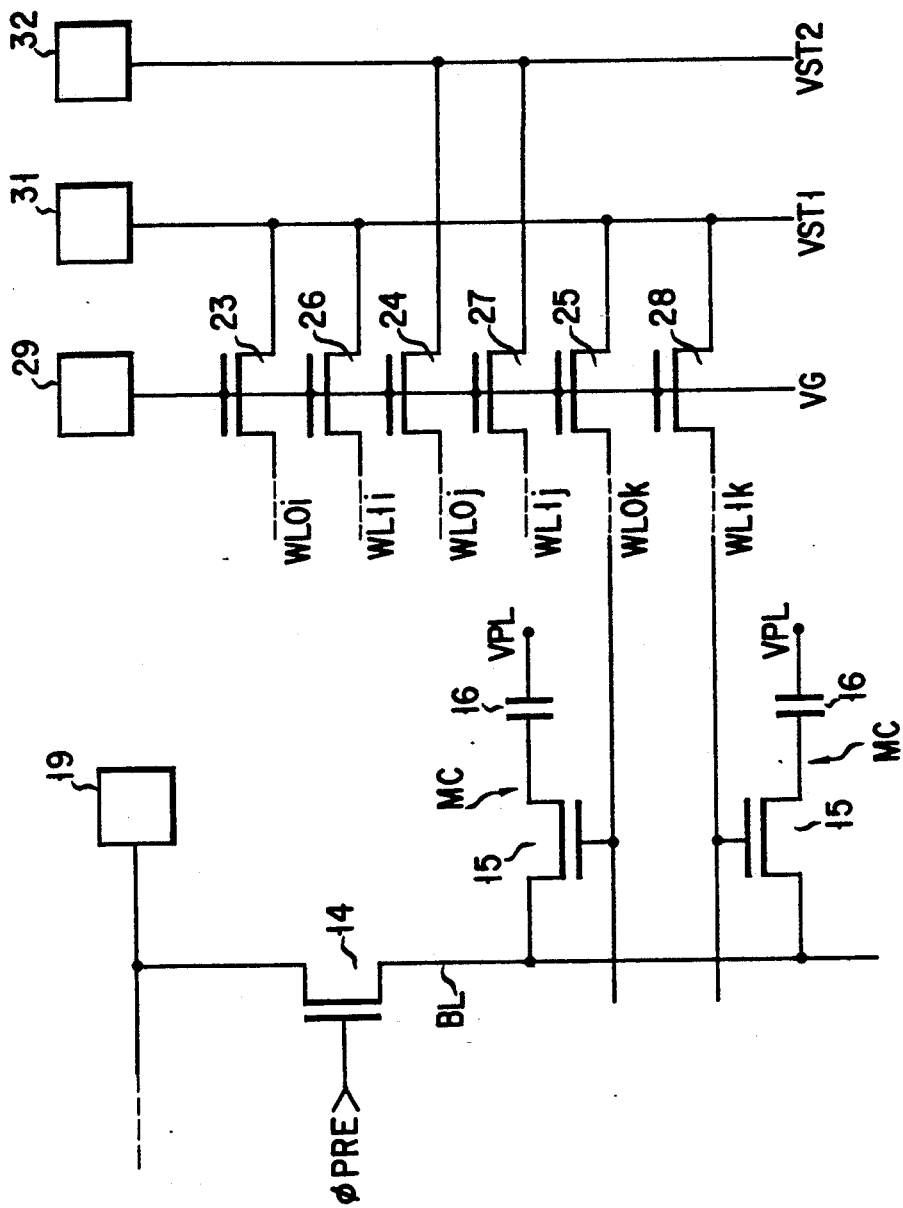
F I G. 5

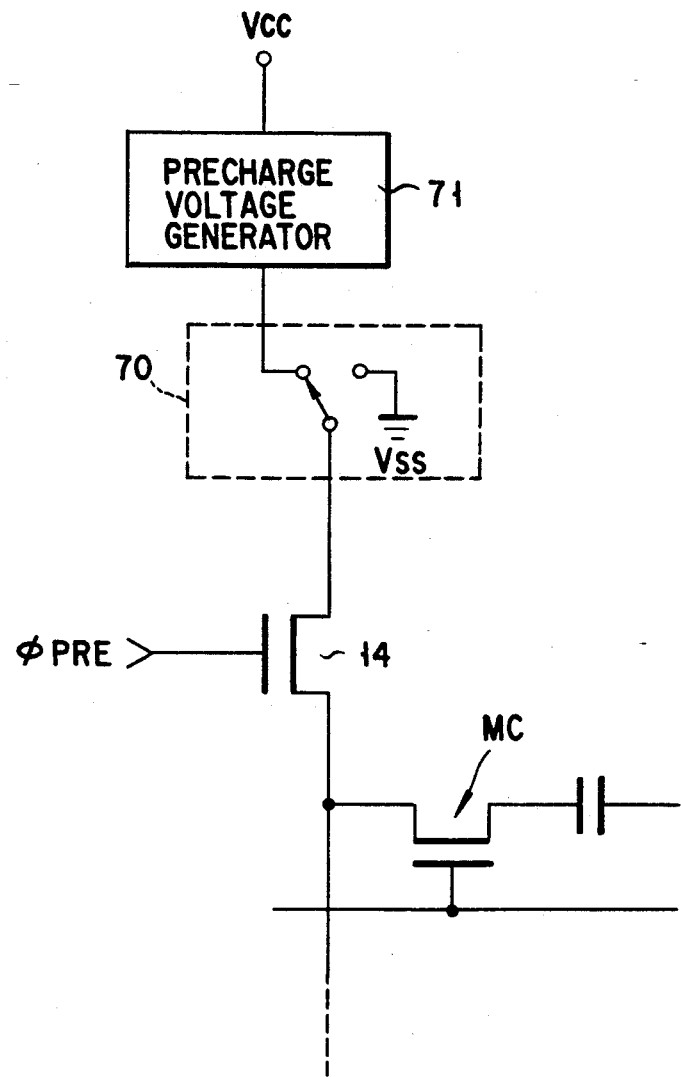
F I G. 7

SEMICONDUCTOR MEMORY

BACKGROUND OF THE INVENTION

1. Field of the Invention

The present invention relates to a semiconductor memory and particularly to stress applying means for applying voltage stress to word line groups more acceleratedly than a normal use at the time of screening defectiveness in a wafer state.

2. Description of the Related Art

In general, in a case where the semiconductor devices are manufactured and shipped, in order to ensure reliability, there is carried out a screening for exposing potentially defective devices and removing the defective devices to prevent the good devices from being deteriorated. As a screening method, there is often used a burn-in method which can realize both a field acceleration and temperature acceleration at the same time. In this method, the device is operated in a state that the voltage is set to be higher than the voltage to be practically used and the temperature is also set to be higher than the temperature to be practically used. In this way, stress, which is larger than the stress occurred in initial trouble under the practical use, is applied to the device for a short period of time. Then, the device, in which defectiveness of the initial operation may occur, is selected in advance before being shipped, thereby efficiently eliminating the device, in which defectiveness of the initial operation may occur, and improving reliability of the products.

In the recent DRAM, a raised voltage (for example, about 1.5×Vcc), is applied to a gate oxide film in a transfer gate (hereinafter called "cell transistor") of the memory cell. Due to this, a strong electrical field is applied thereto even if a film is thicker, and there occurs a problem of reliability. In the burn-in method relating to the DRAM, it is necessary to positively screen the cell transistor in which the pressurized potential voltage is applied to the gate.

Conventionally, in order to perform the screening of a cell transistor in the burn-in of the DRAM, an address scanning method is used such that a word line to be connected to the gate of the cell transistor is sequentially accessed. In this case, voltage stress is applied to the cell transistor less frequently than the case of the transistors of the peripheral circuits. Since the real time of the application of the maximum electrical field is short, a long period of time of the application of the electrical field is required in the burn-in process.

In order to solve the above-mentioned problem, one of inventors of this application proposed a semiconductor memory which can improve efficiency of stress application to the cell transistor in U.S. application No. 07/544,614. According to the above semiconductor memory, in screening defectiveness, voltage stress can be applied to all word lines of the number of word lines which is more than the number of word lines to be selected at time of the normal operation.

If the above invention is applied to the DRAM, screening of the defectiveness of the cell transistor reaches to the level where defectiveness is sufficiently settled. As a result, a bit defectiveness, which is the main defectiveness in the DRAM of 1M or that of 4M, can be settled at a high speed and efficiency of screening defectiveness can be considerably improved.

However, if there is a main factor which brings about defectiveness of reliability between word lines physically adjacent to each other in a region of a memory cell array of the semiconductor memory, there may be a case in which defectiveness of reliability between lines physically adjacent to each other cannot be screened if stress voltage is applied to all word lines at the same time in screening the defectiveness.

SUMMARY OF THE INVENTION

In consideration of the above-mentioned problems, the present invention has been made. An object of the present invention is to provide a semiconductor memory which can improve efficiency of screening defectiveness by applying a predetermined voltage stress to a word line group partially selected at the same time at the time of a voltage stress test, and can screen a main factor which brings about defectiveness of reliability between word lines in a region where a word line in a selective state and a word line in a non-selective state are physically adjacent to each other.

In order to attain the above object, the present invention provides a semiconductor memory comprising selecting means for selecting an arbitrary word line group from a plurality of word line groups into which all word lines are classified in accordance with a predetermined standard at the time of a voltage stress test in screening defectiveness at the same time, and selective stress applying means for applying a predetermined stress to the word line group selected by the selecting means. Each word line group includes the number of word lines, which is more than the number of word lines to be selected at the time of a normal operation, and a plurality of regions, which are physically adjacent to the word lines of the other groups in their array region.

As a specific example of the classification of the group of word lines, the following cases can be considered.

(a) A case in which a certain word line group is alternately adjacent to the other word line group in all regions in the array regions of the groups of the word lines;

(b) A case in which a plurality of regions where a certain word line group is alternately adjacent to the other word line group to the other word line group; and (c) A case including at least one region where the word lines of the other groups exist in both sides of a certain word line group.

According to the semiconductor memory of the present invention, in the plurality of word line groups, there is sequentially performed an operation in which a word line group is selected from the plurality of groups of word lines at the time of a voltage stress test in screening defectiveness at the same time, and a predetermined voltage stress is applied thereto. Thereby, all word lines can be screened in a time divisional manner.

Therefore, efficiency of screening the cell transistor can be considerably improved, and screening can be performed in a state that a word line in a selective state and a word line in a non-selective state are physically adjacent to each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporate in and constitute a part of the specification, illustrate presently preferred embodiments of the invention, and together with the general description given above and the detailed description of the preferred embodiments given below, serve to explain the principles of the invention.

FIG. 1 is a circuit diagram showing a part of a DRAM relating to a first embodiment of the present invention;

FIG. 5 is a circuit diagram showing a part of a DRAM relating to a fourth embodiment of the present invention;

FIG. 7 is a circuit diagram showing the other examples of bit line potential voltage applying means in DRAMs of FIGS. 1, 2, 3, 5 and 6.

DETAILED DESCRIPTION OF THE PREFERRED EMBODIMENTS

Figure 2:
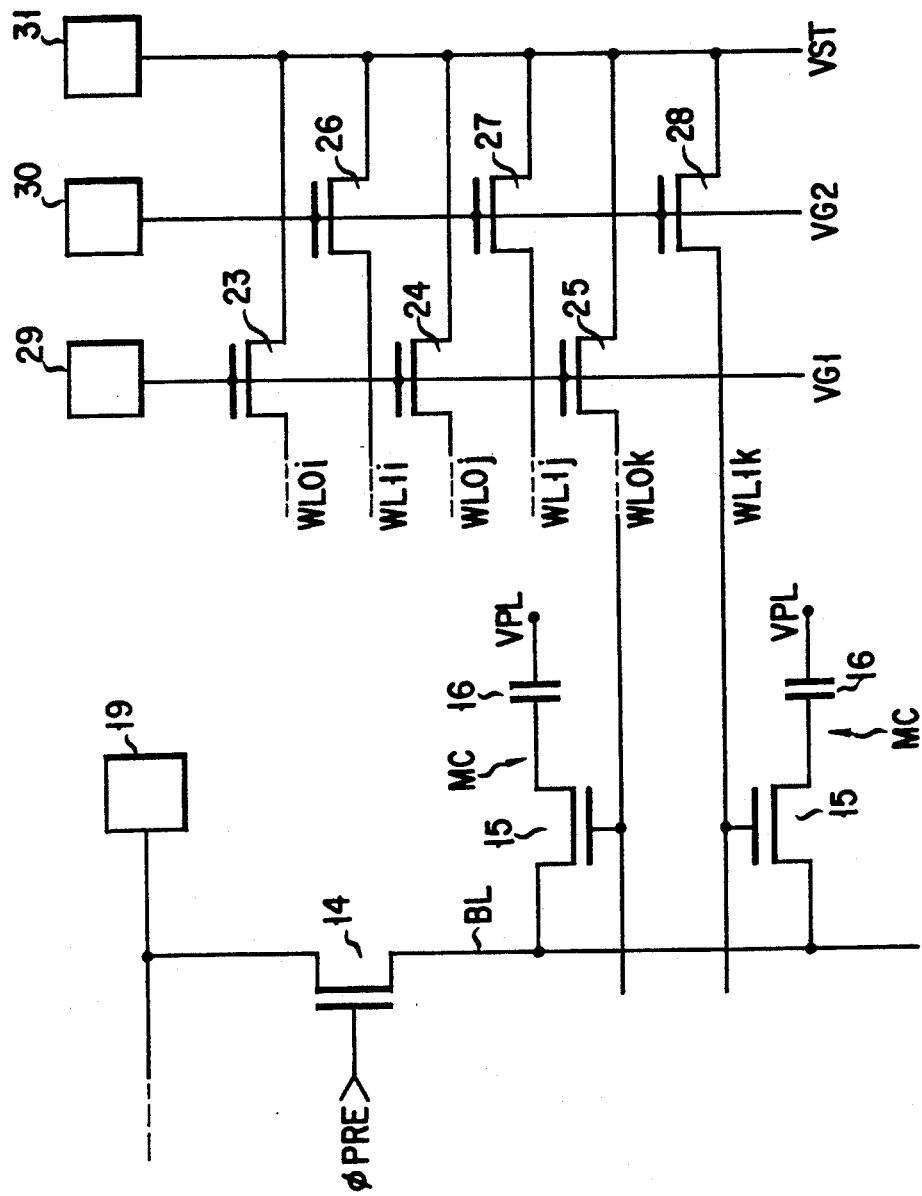
FIG. 2 is a circuit diagram showing a part of a DRAM relating to a second embodiment of the present invention.

The embodiments of the present invention will be explained with reference to drawings. In this explanation, since the same reference numerals are added to the portions common to all drawings, the explanation of the portions common to all drawing will be omitted.

FIG. 1 is a circuit diagram showing a part of a DRAM relating to a first embodiment of the present invention.

In DRAM, a memory cell array has a plurality of memory cells MC (e.g., only two memory cells are shown) arranged in a matrix manner, a plurality of word lines (e.g., WL0i, WL0j, WL0k, WL1i, WL1j, and WL1k) selecting a row of the memory cell array, and a plurality of bit lines (e.g., a pair of bit lines BL, BL) selecting a column of the memory cell array. In the memory cell MC, an NMOS transistor for a transfer gate (cell transistor) 15 and a capacitor 16 for data storage are connected in series. The other end of the capacitor 16 is connected to a capacitor plate potential voltage VPL.

In the memory cell array, the word line of each row is connected to a gate of each cell transistor 15 of the memory cells MC of each row, and the bit line of each column is connected to a drain of each cell transistor 15 of the memory cells MC of each column. The bit line of each column is connected to a bit line precharge power line 17 through an MOS transistor 14 for the bit line precharge. The MOS transistor 14 for the bit line precharge 14 is controlled by a precharge signal $\phi$ PRE.

A latch type sense amplifier, which comprises an N channel sense amplifier NSA for sense operation and a P channel sense amplifier PSA for restoring, is connected between the pair of bit lines BL and BL. In the N channel sense amplifier NSA, each drain of an N channel MOS transistor TN is connected to one of the paired bit lines, and each source is connected to a ground potential voltage (VSS) node. A substrate of the N channel MOS transistor TN (P type) is connected to the VSS node. In the P channel sense amplifier PSA, each source of a P channel MOS transistor TP is connected to the power potential voltage (VCC) node and each drain is connected to one of the paired bit lines.

Moreover, each of MOS transistors 23 to 28 is connected to other end of each word line (WL0i, WL0j, WL0k, WL1i, WL1j, WL1k). The gates of the MOS transistors 23 to 28 are connected to a pad 29 for stress test. The sources of the MOS transistors 23 to 25, which are connected to word lines WL0i, WL0j, WL0k positioned at an odd number in the word line array, are connected to a pad 31 for stress test in common. Similarly, the sources of the MOS transistors 26 to 28, which are connected to word lines WL1i, WL1j, WL1k positioned at an even number in the word line array, are connected to a pad 32 for stress test in common. The pads 29, 30 and 31 are not used at the time of the normal operation of DRAM.

In the above DRAM, all word lines are divided into two groups by whether the position of the word line in the word line array is the odd number or the even number.

The operation of DRAM of FIG. 1 will be explained as follows.

At the time of the normal operation, the transfer gate (not shown) for word line driving is driven to be selectively turned on in accordance with a word line selection signal decoding an address signal by a word line selection circuit (not shown), thereby the word line is selectively driven. At this time, transistors 23 to 28 are controlled to be turned off.

In contrast, in the burned-in process of the DRAM in a wafer state, an operation power is not applied to DRAM (all transistors are turned off).

First of all, a contact terminal of a tester (for example, a needle of a probe card) is brought into contact with the pad 31 and a predetermined stress voltage VST1 is applied thereto, and a gate voltage VG, which is more than VST1+V th (threshold voltage of MOS transistors 23 to 28), is applied to the pad 29, so that MOS transistors 23 to 25 are driven to be turned on. As a result, word lines WL0i, WL0j, WL0k of only one group can be selected through MOS transistors 23 to 25 at the same time. A predetermined voltage stress can be applied between the selected word lines and the substrate at the same time. At this time, a low voltage is applied to the pad 32 to control MOS transistors 26 to 28 to be turned off.

Next, stress voltage VST2 (=VST1) is applied to the pad 32 and the gate voltage VG is applied to the pad 29, so that MOS transistors 26 to 28 are driven to be turned on. As a result, word lines WL1i, WL1j, WL1k of only the other group can be selected through MOS transistors 26 to 28 at the same time. A predetermined voltage stress can be applied between the selected word lines and the substrate at the same time. At this time, a low voltage is applied to the pad 31 to control MOS transistors 23 to 25 to be turned off.

According to DRAM of FIG. 1, when the DRAM is burned-in in a wafer state, one arbitrary word line group of classified two word line groups is selected only by applying the voltage for stress voltage to the pad without supplying operation power to DRAM at the same time. Then, the stress voltage can be applied to the selected word line through the MOS transistor. By performing such an operation twice, all word lines can be efficiently screened in a time divisional manner, so that efficiency of burn-in can be considerably improved.

Additionally, it is possible to screen the main factor of defectiveness of reliability between the word, lines in the region where the word line in the selected state ("H" level) and the word line in the non-selected state ("L" level) are physically adjacent to each other. In other words, word lines WL0i, WL0j, WL0k of one group are alternately physically adjacent to word lines WL1i, WL1j, WL1k of the other group in the entire region of the array region of the word line group. Thereby, the voltage stress can be applied between the word lines of two groups and the main factor of defectiveness of reliability exists between the word lines can be screened. In this case, even if a thin wire to be shorted between the word lines remains in a word line forming process, short current flows into the thin residual wire, thereby, the thin wire is fused, and defectiveness of short between the word lines can be improved.

Also, in a case where there is used a DRAM having the structure wherein a lower portion electrode (electric charge storing electrode) of stack typed capacity exists between the word lines, which are physically adjacent to each other, and a part of the word lines is opposed to a charge storing node, the electric charge storing node becomes ground potential voltage voltage Vss in a state that no operation power is supplied to DRAM as mentioned above. Due to this, the stress voltage is applied to the word line at the time of the voltage stress test, thereby screening the main factor of defectiveness of reliability existing between the word line and the electric charge storing node.

The following explains the methods for fixing the voltage between the bit lines BL, $\overline{BL}$ at the time of the above-mentioned voltage stress test.

The first method is that an entire wafer is fixed to the ground potential voltage state that no operation power is supplied to DRAM. Thereby, the bit line potential voltage serves as the ground potential voltage Vss, and high stress voltage can be applied between the selected word line and the bit line, that is, the gate of the selected cell transistor and the drain. In this case, the pad 19 for stress test can be omitted.

The second method is that VCC node and VSS node are set to 0V, respectively and the substrate (N well) of the P channel transistor TP of the P channel sense amplifier PSA serves as group potential voltage VSS. Thereby, a PN junction between the drain of the P channel transistor TP and the N well is forward-biased and the bit line potential voltage becomes a built-in potential &5 B (potential voltage which is slightly higher than the ground voltage VSS) which is determined by the forward bias of the PN junction. Therefore, high stress voltage can be applied between the gate of the selected cell transistor and the drain. In this case, the pad 19 for stress test can be omitted.

The third method is that the precharge signal $\phi$ PRE is supplied so that the MOS transistor 14 for bit line precharge is turned on, and the voltage is applied to the bit lines BL, $\overline{BL}$ from the pad 19 for stress test. Thereby, the predetermined voltage can be applied to the bit line, and a predetermined high stress voltage can be applied between the gate of the selected cell transistor and the drain.

FIG. 2 shows a part of the DRAM relating to the second embodiment of the present invention.

In the DRAM of FIG. 2, each source of MOS transistors 23 to 25 and 26 to 28 is connected to the pad 31 in common, each gate of MOS transistors 23 to 25 is connected to the pad 29 in common, and each gate of MOS transistors 26 to 28 is connected to the pad 30 in common.

The operation of the DRAM of FIG. 2 is basically the same as the DRAM of FIG. 1. However, the operation in performing the burn-in is slightly different from that of FIG. 1.

First, stress voltage VST is applied to the pad 31 and gate voltage VGI having VST+V th or more is applied to the pad 29, so that MOS transistors 23 to 25 are turned on. Thereby, a predetermined voltage stress is applied to the word lines WL0i, WL0j, WL0k of one group connected to the pad 31 through MOS transistors 23 to 25. At this time, the voltage, which is lower than the voltage (VST+V th), is applied to the pad 30 and MOS transistors 26 to 30 are turned off.

Next, the stress voltage VST is applied to the pad 31, gate voltage VG2 having VST+V th or more is applied to the pad 30, and MOS transistors 26 to 28 are turned on. Thereby, voltage stress is applied to the word lines WL1i, WL1j, WL1k of the other group connected to the pad 31 through MOS transistors 26 to 28. At this time, the voltage, which is lower than the voltage (VST+V th), is applied to the pad 29 and MOS transistors 23 to 25 are turned off.

Therefore, the word lines WL0i, WL0j, WL0k and the word lines WL1i, WL1j, WL1k are structured to be physically adjacent, thereby applying the voltage stress between the word lines of each of two groups, and screening the main factor of defectiveness of reliability existing between the word line.

Figure 3:
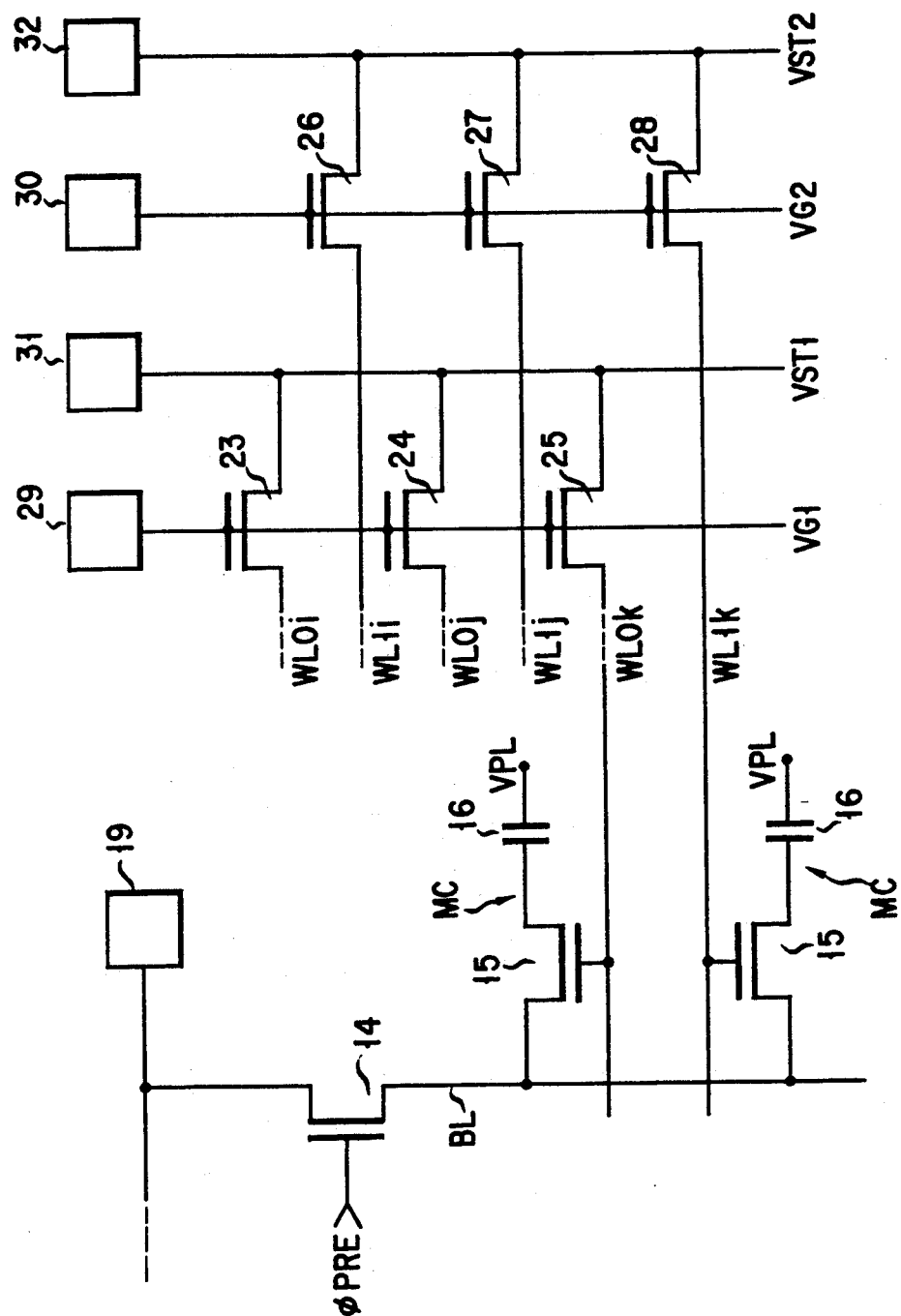
FIG. 3 is a circuit diagram showing a part of a DRAM relating to a third embodiment of the present invention.

FIG. 3 shows a part of the DRAM relating to the third embodiment of the present invention.

In the DRAM of FIG. 3, each gate of MOS transistors 23 to 25 is connected to the pad 29 in common, each source of MOS transistors 23 to 25 is connected to the pad 31 in common, each gate of MOS transistors 26 to 28 is connected to the pad 30 in common, and each source of MOS transistors 26 to 28 is connected to the pad 32 in common.

The operation of the DRAM of FIG. 3 is basically the same as the DRAM of FIG. 1. However, the operation in performing the burn-in is slightly different from that of FIG. 1.

First, stress voltage VST1 is applied to the pad 31, gate voltage VGI is applied to the pad 29, and MOS transistors 23 to 25 are turned on. Thereby, a predetermined voltage stress is applied to the word lines WL0i, WL0j, WL0k of one group connected to the pad 31 through MOS transistors 23 to 25. At this time, the low voltage is applied to the pads 30 and 32 such that MOS transistors 26 to 28 are turned off.

Next, the stress voltage VST2 is applied to the pad 32, gate voltage VG2 is applied to the pad 30, and MOS transistors 26 to 28 are turned on. Thereby, voltage stress is applied to the word lines WL1i, WL1j, WL1k of the other group connected to the pad 32 through MOS transistors 26 to 28. At this time, the voltage is applied to the pads 29 and 31 such that MOS transistors 23 to 25 are turned off.

Therefore, the word lines WL0i, WL0j, WL0k and the word lines WL1i, WL1j, WL1k are structured to be physically adjacent, thereby applying the voltage stress between the word lines of each of two groups, and screening the main factor of defectiveness of reliability existing between the word line.

In the above embodiments, the voltage stress can be applied in an AC-like manner (pulse-like manner) or a DC-like manner. In view of the point that the application of the voltage stress is efficiently accelerated, it is desirable that the voltage stress be applied in the DC-like manner.

The sizes of MOS transistors 23 to 28 are preferably set to be in the range where no influence is exerted on the voltage stress applying the other word lines even if the gate oxide film of the cell transistor is broken by the application of the stress voltage to a certain word line and the word line level is lowered by current leakage. Thereby, it is possible to avoid the state in which a field acceleration of the other gate cannot be performed by the breakage of one portion of the gate of the cell transistor.

Moreover, an impurity diffusion layer (N - type) having low concentration may be formed in the source regions of MOS transistors 23 to 28 in order to withstand the high voltage.

Figure 4:
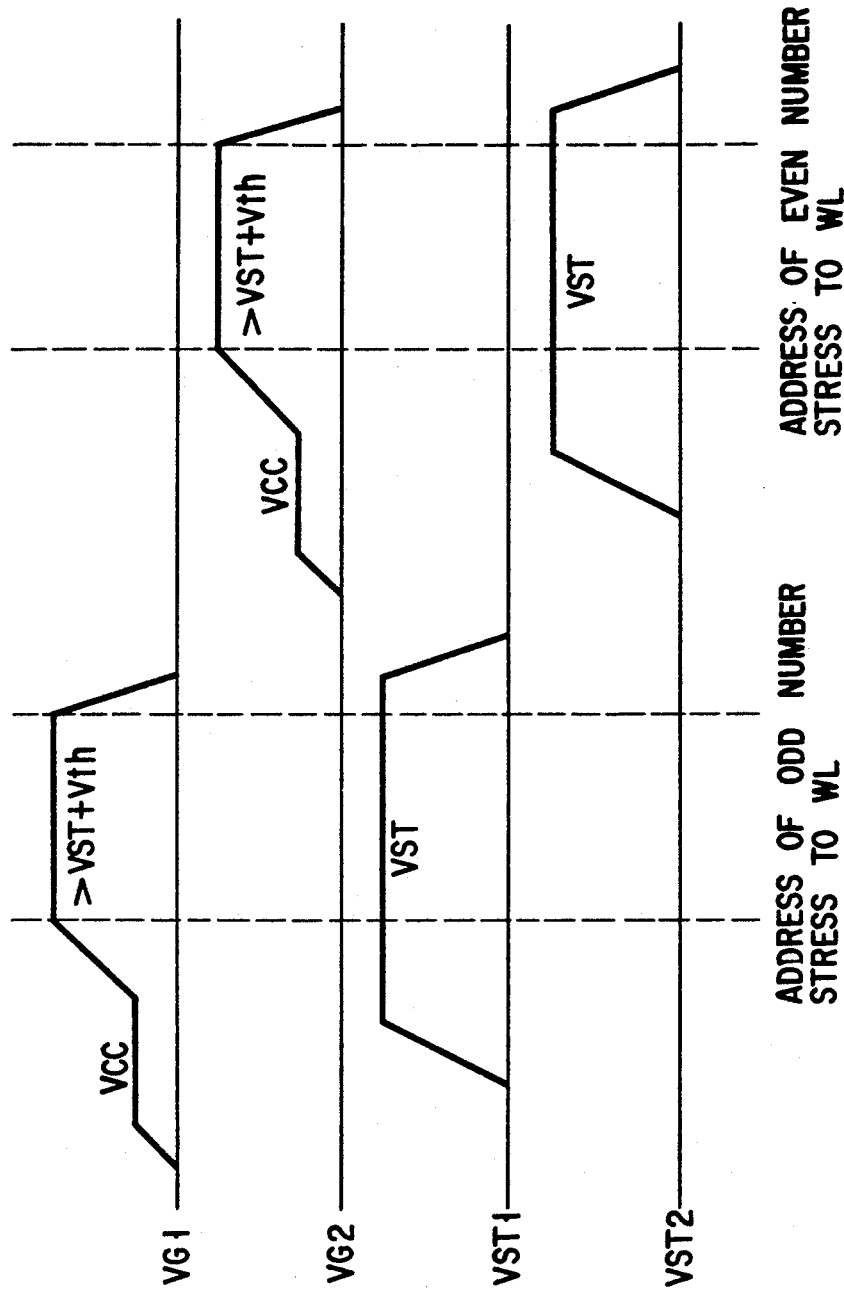
FIG. 4 is a timing waveform showing an example of a method for a voltage stress test of the DRAM of FIG. 3.

Furthermore, at the time of the burn-in operation to the DRAM of FIG. 3, the gate oxide film of each of the MOS transistors 23 to 28 can be screened by the method as shown in FIG. 4.

First of all, for example, the power voltage VCC is applied to the pad 29, thereafter, voltage VST, serving as stress voltage VST1, is applied to the pad 31. In this stage, after waiting until the potential voltage of word lines WL0i, WL0j, WL0k (for example, word line of odd number) of one group rises up to the voltage of VCC−Vth, a voltage of VST+V th or more, serving as gate voltage VG1, is applied to the pad 29. Thereby, voltage stress is applied to the word lines VL0i, WL0j, WL0k. Next, the power voltage VCC is applied to the pad 30, thereafter, voltage VST, serving as stress voltage VST2, is applied to the pad 32. In this stage, after waiting until the potential voltage of word lines WL1i, WL1j, WL1k (for example, word line of even number) of the other group rises up to the voltage of VCC−Vth, voltage of VST+V th or more, serving as gate voltage VG2, is applied to the pad 30. Thereby, voltage stress is applied to the word lines VL1i, WL1j, WL1k.

According to the above-mentioned method, gate electrode VG1 of VST+V th or more is not directly applied to the gate oxide film of each of MOS transistors 23 to 25, and the gate oxide film of each of the MOS transistors 23 to 25 can be prevented from being broken. Similarly, gate electrode VG2 of VST+V th or more is not directly applied to the gate oxide film of each of MOS transistors 26 to 28, and the gate oxide film of each of the MOS transistors 26 to 28 can be prevented from being broken.

According to the present invention, the classification of the group of all word lines is made such that the selected group of word lines includes the number of word lines, which is more than that of word lines to be selected at the time of the normal operation, and includes a plurality of regions, which are physically adjacent to the word lines of the other group in the array region of the word line group. More specifically, the following cases can be considered.

(a) A case in which a certain word line group is alternately adjacent to the other word line group in all regions in the array regions of the groups of the word lines;

(b) A case in which a plurality of regions where a certain word line group is alternately adjacent to the other word line group to the other word line group; and (c) A case including at least one region where the word lines of the other groups exist in both sides of a certain word line group.

FIG. 5 shows a part of the DRAM relating to the fourth embodiment of the present invention. In the DRAM of FIG. 5, the classification of the word lines WL0i, WL0j, WL0k, WL1i, WL1j, WL1k and that of MOS transistors 23 to 28 to be connected to these word lines are different from the cases of FIGS. 1, 2, and 3. More specifically, two word lines WL0j and WL1j, which are arranged to be physically adjacent to each other, are paired, and each source of MOS transistors 23 and 26, which are connected to these word lines, is connected to the pad 31 in common. Moreover, two word lines WL0 and WL1, which are arranged to be physically adjacent to each other, are paired, and each source of MOS transistors 24 and 27, which are connected to these word lines, is connected to the pad 32 in common. Moreover, two word lines WL0k and WL1k, which are arranged to be physically adjacent to each other, are paired, and each source of MOS transistors 25 and 28, which are connected to these word lines, is connected to the pad 31 in common. Each gate of MOS transistors 23 to 28 is connected to the pad 29 in common.

The classifications of the word lines in the DRAM of FIG. 5 correspond to the above-mentioned case (b) in which a plurality of regions where a certain word line group is alternately adjacent to the other word line group to the other word line group; and the case (c) including at least one region where the word lines of the other groups exist in both sides of a certain word line group.

Therefore, at the time of the burn-in of the DRAM, the voltage stress is applied by the operation in accordance with DRAMs of FIGS. 1, 2 and 3. Thereby, the screening efficiency of the cell transistor ean be considerably improved, and the screening can be performed in a state that the word lines of the selected state and those of the non-selected state are physically adjacent.

Figure 6:
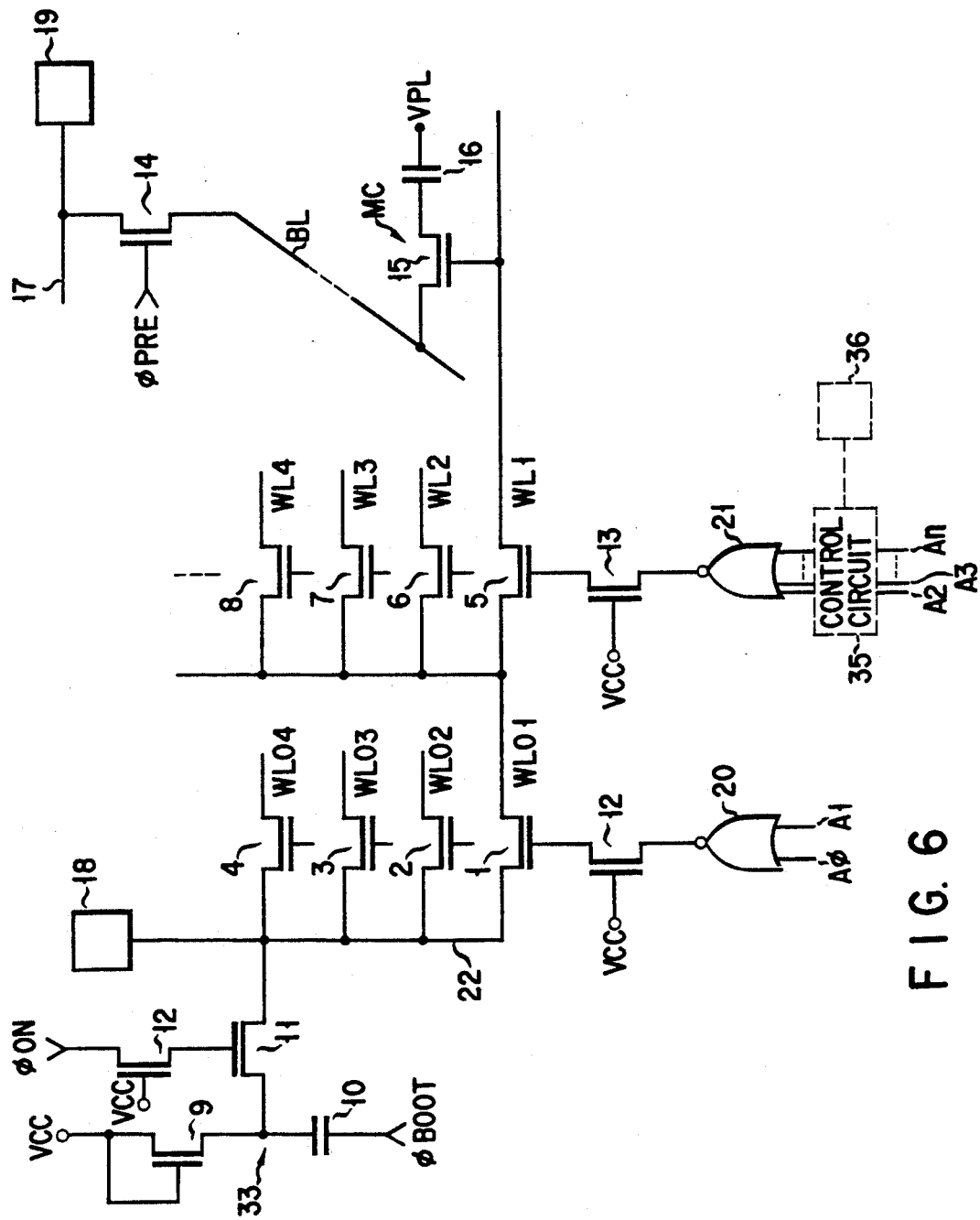
FIG. 6 is a circuit diagram showing a part of a DRAM relating to a fifth embodiment of the present invention.

FIG. 6 is a circuit diagram showing a part of the DRAM relating to the fifth embodiment of the present invention.

In this embodiment, there is provided the structure wherein the selection of the word lines can be easily performed in accordance with the predetermined group classification by only the input operation of an address signal from the external unit in a state that the operation power is supplied to the DRAM in the form of the wafer.

In the above-mentioned DRAM, the memory cell array has a plurality of memory cells MC (e.g., only one memory cell is shown) arranged in a matrix manner, a plurality of word lines (e.g., WL01, WL02, WL03, WL04, and WL1, WL2, WL3, WL4, . . . ) selecting a row of the memory cell array, and a plurality of bit lines (e.g., one bit line BL is shown) selecting a column of the memory cell array. In the memory cell MC, an NMOS transistor for a transfer gate (cell transistor) 15 and a capacitor 16 for data storage are connected in series. The other end of the capacitor 16 is connected to a capacitor plate potential voltage VPL.

In the memory cell array, the word lines WL1 to WL4 are connected to a gate of each cell transistor 15 of the memory cells MC of each row, and the bit line of BL of each column is connected to a drain of each cell transistor 15 of the memory cells MC of each column. The bit line of each column is connected to a bit line precharge power line 17 through an MOS transistor 14 for the bit line precharge. The MOS transistor 14 for the bit line precharge 14 is controlled by a precharge signal $\phi$ PRE.

Reference numeral 33 is a word line potential voltage rising circuit. A MOS transistor 9 for rising voltage barrier and a MOS capacitor 10 for rising voltage are series-connected between VCC node and a rising voltage signal $\phi$ BOOT applying node. One end of the MOS transistor 11 for transfer gate is connected to the connection node of the transistor 9 and the capacitor 10. The MOS transistor 12 for rising voltage barrier is inserted between the gate of the transistor 11 and the control signal $\phi$ on applying node. Power voltage VCC is applied to the gate of the transistor 12. The control signal $\phi$ on is activated at the time of the normal operation, and the transistor 11 for transfer gate is turned on. The control signal $\phi$ on is not activated at the time of voltage stress test and transistor 11 is turned off.

The word line driving transfer gates 1 to 4 of the first stage are connected between the other end (node 22) of the transistor 11 and the first word line WL0m (m=1, 2, 3, 4), respectively. The word line driving transfer gates 5 to 8 of the second stage are connected between the first word line WL01 and the second word line WLn (n=1, 2, 3, 4), respectively. Similar to the first word line WL01, the first word lines WL02, WL03, WL04 are also connected to the second word line (not shown) through the word line driving transfer gate (not shown) of the second stage.

A0 to An show address signals. A first word line selecting circuit (for example, NOR gate) 20 decodes address signals A0 and A1. The output end of the first word selecting circuit 20 is connected to each gate of the MOS transistors for the transistor gates 1 to 4 through the transistor 12 for rising voltage barrier (e.g., only one is shown). Power voltage VCC is applied to the gate of the transistor 12.

A plurality of second word line selecting circuits (for example, NOR gate) 21 decode address signals A2 to An. Each output end of the second word selecting circuits 21 is connected to each gate of the MOS transistors for the transistor gates 5 to 8 through the transistor 13 for rising voltage barrier (e.g., only one is shown). Power voltage VCC is applied to the gate of the transistor 13.

Reference numerals 18 and 19 are pads for stress test to which a predetermined voltage is applied from the external unit at the time of voltage stress test. The pad 18 is connected to the node 22, and the pad 19 is connected to the bit line precharge power line 17 These pads 18 and 19 are not operated at the time of the normal operation.

An operation of DRAM of FIG. 6 will be explained as follows.

In the normal operation, the transfer gates 1 to 8 are driven to be selectively turned on in accordance with the word line selecting signal decoding address signals A0 to An (in actual, complementary signal) by the word line selecting circuits 20 and 21, thereby the word line is selectively driven. At this time, a bit line precharge voltage is applied to one end of the bit line precharge transistor 14 from a bit line precharge voltage generator (not shown).

In the burned-in process of the DRAM in a wafer state, the operation power is supplied to enable the DRAM to operate. Then, address signals A0, A1 are set to, for example, 0, 0, and the transfer gates 1 to 4 are turned on. At the same time, address signals A2 to An are set such that the transfer gates 5 to 8 are partially turned on. Thereby, the arbitrary word line group is selected from the plurality of groups to which all word lines are classified. Then, voltage stress is applied to the selected word line group from the pad 18 for stress test through a part of the word line driving transfer gates 1 to 8.

Next, address signals A2 to An are set such that the transfer gates 5 to 8 are partially turned on. Then, voltage stress is applied to the selected word line group from the pad 18 for stress test through a part of the word line driving transfer gates 1 to 8.

As mentioned above, the word line group is selected from the plurality of word line groups and a predetermined voltage stress is applied to the selected word line group. Such an operation is sequentially performed in the plurality of word line groups, thereby all word lines can be screened in a time divisional manner. Moreover, burn-in efficiency can be considerably improved, and it is possible to screen the main factor of defectiveness of reliability between the word lines in the region where the word line in the selected state ("H" level) and the word line in the non-selected state ("L" level) are physically adjacent to each other.

In this case, addresses A2 to An are controlled to sequentially select the odd address and the even address. As a result, screening is performed in a state that only one word line to which the second word line WLn is physically adjacent is selected and driven. Thereafter, screening is performed in a state that only the other word line to which the second word line WLn is physically adjacent is selected. Thereby, all word lines are divided into two and can be screened, and screening can be efficiently performed.

According to the DRAM of FIG. 6, the selection of the word lines can be easily performed in accordance with the predetermined group classification by only the input operation of an address signal from the external unit.

Moreover, there is a case in which the desirable selection cannot be obtained by only the input operation of the address signal from the external unit, depending on the relationship between the actual array of the word line groups and the input of the address signal or the way of the group classification as in the DRAM of FIG. 6. In this case, for example, as shown in a dotted line of FIG. 6, there is added a control circuit 35 and a pad 36 connected to the control circuit 35 to the input (or output) side of the word line selecting circuit 21.

The control circuit 35 does not change the input (output) of the word line selection circuit 21 at the time of the normal operation. However, the control circuit 35 changes the input (output) of the word line selection circuit 21 based on the control signal from the pad 36 at the time of the voltage stress test. Then, the word line selection circuit 21 is controlled to perform the word line selection in accordance with the above mentioned group classification.

Normally, the capacity value of the capacitor 10 for word line voltage rising is prepared to only the extent that the word line to be selected at the time of the normal operation is driven. Due to this, it is insufficient to drive all word lines or the word lines, which are more than the number of the word lines to be selected at the normal time, by only the above increased voltage at the same time.

In order to solve the above problem, according to the DRAM of FIG. 6, the pad 18 for stress test, which is not used at the time of the normal operation, is connected to the node 22. Then, the desirable voltage stress is applied to the node 22 in a DC- like manner through the bonding pad 18 from the external unit, thereby the selected word line can be immediately dri-ven.

In this case, the transfer transistors 1 to 8 are respectively driven, thereafter, MOS transistors 12 or 13 is turned off. Due to this, the gates of the transfer transistors 1 to 8 are electric-potentially floated. Thereby, the level of each gate decreases due to current leakage, and voltage stress, which was applied to the node 22 in a DC-like manner, may gradually decrease at the word lines. In order to avoid this problem, for example, a pulse voltage, serving as voltage stress, may be applied to the node 22 in an AC-like manner.

Moreover, at the time of the voltage stress test, the predetermined voltage is applied to the bit line BL from the external unit through the pad 19, and the bit line precharge transistor 14 is controlled to be turned on. Thereby, the desirable stress voltage can be applied between the gate of the selected cell transistor 15 and the drain thereof. In this case, it is possible to apply high stress voltage between the selected word line and the bit line by applying the ground voltage VSS to the pad 19.

In the above-mentioned embodiments, the pad 19 may be omitted, and a bit line voltage applying circuit 70 may be connected to the bit line BL as shown in FIG. 7.

In FIG. 7, reference numeral 71 is a bit line precharge voltage generator, which generates an intermediate voltage between power voltage VCC and ground voltage VSS (normally VCC/2). The bit line voltage applying circuit 70 selects the output of the bit line precharge voltage generator 71 at the time of the normal operation, and selects a fixed voltage end (for example, VSS node) at the time of the voltage stress test to be connected to the bit line BL.

According to the circuit of FIG. 7, the intermediate voltage between power voltage VCC and ground voltage VSS is output to the bit line at the time of the normal operation, and the ground voltage is output to the bit line at the time of the voltage stress test.

In the above-mentioned embodiments, the predetermined voltage is applied from the pad, which is not used at the time of the normal operation. However, there may be provided means for changing the function as a pad in a normal operation mode and a stress test mode, and the pad, which is used at the time of the normal operation, can be used.

Moreover, in the above embodiments, the bonding pad is used as the structure of the pads 18, 19, 29 to 32. The present invention is not limited to the above structure. The pads, which can come in contact with a probe of a probe card of a tester and apply the voltage for stress test, may be used in the burn-in process of the DRAM in a wafer form. Or, in a case where a DRAM chip is separated from the wafer and burned-in, the pads, which can be connected to the wire of the outer portion of the chip, may be used.

Moreover, in the burned-in process of the DRAM in a wafer form as it is, the pad for the stress test may be provided for each chip. In this case, the pad is used in common on the plurality of chips, and a wire for connecting the portion between the common pad and the plurality of chips may be formed on, for example, a dicing line region of the wafer.

The following methods can be considered as a method for applying the stress voltage or the gate voltage to be used for the voltage stress test:

(a) A method in which such the voltage is input applied to a dedicated pad from the outer unit at the state of the wafer state as mentioned in the embodiments;

(b) A method in which the voltage is input from the outer unit via a dedicated testing wire on the wafer at the wafer state; and (c) A method in which the voltage is input from the outer unit via a dedicated terminal, which is not used at the time of a normal operation, after packaging.

In the above embodiments, there was shown the DRAM in which a refresh operation is needed. However, the pad for the stress test may be provided for each chip. In this case, the present invention is not limited to the above-mentioned embodiments. The present invention can be applied to a static RAM using a flip-flop as a memory cell, various kinds of memory integrated circuits, and a embeded memory integrated circuit.

Moreover, the above-mentioned embodiments explained the case of the voltage stress test when the burn-in is performed. However, it is needless to say that the present invention is effective in the case that the voltage stress test is performed without regardless of temperature acceleration.

The embodiments shown in the specification and the drawings do not limit the present invention. Various modifications may be made without departing from the gist of the present invention and the scope of the invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory, comprising:
a plurality of word lines;
a plurality of bit lines intersecting said word lines;
a memory cell array comprising memory cells arranged at respective intersections of said word lines and bit lines;
word line selecting circuits for selecting said word lines in accordance with an address signal;
word line driving circuits connected to said word lines for driving selected word lines; and
selective stress applying means for selectively applying stress, during a stress test, to word lines in one of a plurality of word line groups into which all said word lines are classified, said selective stress applying means comprising:
first MOS transistors each having a source, a drain connected to a respective one of the word lines in a first word line group, and a gate;
second MOS transistors each having a source, a drain connected to a respective one of the word lines in a second word line group, and a gate;
a first pad connected to the gates of all of said first and second MOS transistors for receiving a gate voltage to be applied to said gates of all of said first and second MOS transistor;

a second pad connected to the sources of all of said first MOS transistors for receiving a stress voltage to be applied to said sources of all of said first MOS transistors; and a third pad connected to the sources of all of said second MOS transistors for receiving a stress voltage to be applied to said sources of all of said second MOS transistors.

2. A semiconductor memory, comprising:

a plurality of word lines;

a plurality of bit lines intersecting said word lines;

a memory cell array comprising memory cells arranged at respective intersections of said word lines and bit lines;

word line selecting circuits for selecting said word lines in accordance with an address signal;

word line driving circuits connected to said word lines for driving selected word lines; and selective stress applying means for selectively applying stress, during a stress test, to word lines in one of a plurality of word line groups into which all said word lines are classified, said selective stress applying means comprising:

first MOS transistors each having a source, a drain connected to a respective one of the word lines in a first word line group, and a gate;

second MOS transistors each having a source, a drain connected to a respective one of the word lines in a second word line group; and a gate;

a first pad connected to the gates of all of said first MOS transistors for receiving a gate voltage to be applied to said gates of all of said first MOS transistors;

a second pad connected to the gates of all of said second MOS transistors for receiving a gate voltage to be applied to said gates of all of said second MOS transistors; and a third pad connected to the sources of all of said first and second MOS transistors for receiving a stress voltage to be applied to said sources of all of said first and second MOS transistors.

3. A semiconductor memory, comprising:

a plurality of word lines;

a plurality of bit lines intersecting said word lines;

a memory cell array comprising memory cells arranged at respective intersections of said word lines and bit lines;

word line selecting circuits for selecting said word lines in accordance with an address signal;

word line driving circuits connected to said word lines for driving selected word lines; and selective stress applying means for selectively applying stress, during a voltage stress test, to word lines in one of a plurality of word line groups into which all said word lines are classified, said selective stress applying means comprising:

first MOS transistors each having a source, a drain connected to a respective one of the word lines in a first word line group, and a gate;

second MOS transistors each having a source, a drain connected to a respective one of the word lines in a second word line group, and a gate;

a first pad connected to the gates of all of said first MOS transistors for receiving a gate voltage to be applied to said gates of all of said first MOS transistors;

a second pad connected to the sources of all of said second MOS transistors for receiving a gate voltage to be applied to said gates of all of said second MOS transistors;

a third pad connected to the sources of all of said first MOS transistors for receiving a voltage to be applied to all of said sources of said first MOS transistors; and a fourth pad connected to the sources of all of said second MOS transistors for receiving a voltage to be applied to all of said sources of said second MOS transistors.

4. The semiconductor memory according to any of of claims 1 to 3, wherein word lines which are physically adjacent to each other are in different groups.

5. The semiconductor memory according to any one of claims 1 to 3, wherein each word line of said first group is adjacent to another word line of said first group and one word line of said second group.

6. The semiconductor memory according to any one of claims 1 to 3, wherein the word lines of said second group are on both sides of the word lines of said first group.

7. The semiconductor memory according to any one of claims 1 to 3, wherein said word line driving circuits are connected to first ends of said word lines, and said MOS transistors are connected to second ends of said word lines.

8. The semiconductor memory according to any one of claims 1 to 3, further comprising a bit line voltage applying circuit for changing a voltage to be applied to said bit lines at the time of a normal operation and at the time of a voltage stress test.

9. The semiconductor memory according to claim 8, wherein said bit line voltage applying circuit applies a voltage which is between a power source voltage and a ground voltage to said bit lines at the time of the normal operation, and the ground voltage to said bit lines at the time of the voltage stress test.

10. A semiconductor memory, comprising:

a plurality of word lines;

a plurality of bit lines intersecting said word lines;

a memory cell array comprising memory cells arranged at respective intersections of said word lines and bit lines;

word line selecting circuits responsive to address signals for selecting said word lines;

word line driving circuits connected to said word lines for driving selected word lines; and stressing circuitry for selectively stressing word lines in one or the other of a first and a second word line group during a stress test, said stressing circuitry including:

a plurality of test pads;

first switching elements each having a first terminal connected to a respective one of the word lines in said first word line group, a second terminal, and a control terminal; and second switching elements each having a first terminal connected to a respective one of the word lines in said second word line group, a second terminal, and a control terminal, wherein said second terminals and said control terminals of said first switching elements are connected to test pads in a first group of test pads and said second terminals and said control terminals of said second switching elements are connected to a test pads in a second group of test pads, said second group of test pads including at least one test pad not in said first group of test pads.

* * * * *